United States Patent
Bangsaruntip et al.

(10) Patent No.: US 8,558,219 B2
(45) Date of Patent: Oct. 15, 2013

(54) NANOWIRE FIELD EFFECT TRANSISTORS

(75) Inventors: Sarunya Bangsaruntip, Mount Kisco, NY (US); Guy Cohen, Mohegan Lake, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/606,365

(22) Filed: Sep. 7, 2012

(65) Prior Publication Data

US 2013/0178019 A1    Jul. 11, 2013

Related U.S. Application Data

(63) Continuation of application No. 13/343,799, filed on Jan. 5, 2012.

(51) Int. Cl.
*H01L 21/335* (2006.01)
*B82Y 40/00* (2011.01)
*B82Y 99/00* (2011.01)

(52) U.S. Cl.
USPC .......................... 257/29; 257/E21.4; 438/149

(58) Field of Classification Search
USPC .......................................................... 257/29
See application file for complete search history.

(56) References Cited

U.S. PATENT DOCUMENTS

| | | |
|---|---|---|
| 7,892,956 B2 | 2/2011 | Deligianni et al. |
| 7,893,492 B2 | 2/2011 | Bedell et al. |
| 2004/0152272 A1 | 8/2004 | Fladre et al. |
| 2008/0014689 A1 | 1/2008 | Cleavelin et al. |
| 2008/0135949 A1 | 6/2008 | Lo et al. |
| 2009/0057762 A1 | 3/2009 | Bangsaruntip et al. |
| 2009/0302377 A1 | 12/2009 | Son et al. |
| 2010/0259296 A1 | 10/2010 | Or-Bach |
| 2011/0012090 A1 | 1/2011 | Singh et al. |
| 2011/0133164 A1 | 6/2011 | Bangsaruntip et al. |
| 2011/0133165 A1 | 6/2011 | Bangsaruntip et al. |
| 2011/0278546 A1 | 11/2011 | Bangsaruntip et al. |

OTHER PUBLICATIONS

Appenzeller, J. et al., "Toward Nanowire Electronics," IEEE Transaction on Electron Devices, vol. 55, No. 11, Nov. 2008, 21 pages.
Lind, E. et al., "High Frequency Performance of Vertical InAs Nanowire MOSFET," IEEE 2010 International Conference on Indium Phosophide & Related Materials, May 31, 2010-Jun. 4, 2010, pp. 1-4.

(Continued)

*Primary Examiner* — Jarrett Stark
*Assistant Examiner* — Lawrence Tynes, Jr.
(74) *Attorney, Agent, or Firm* — Cantor Colburn LLP; Vazken Alexanian

(57) ABSTRACT

A method for forming a nanowire field effect transistor (FET) device includes forming a nanowire over a substrate, forming a liner material around a portion of the nanowire, forming a capping layer on the liner material, forming a first spacer adjacent to sidewalls of the capping layer and around portions of the nanowire, forming a hardmask layer on the capping layer and the first spacer, removing an exposed portion of the nanowire to form a first cavity partially defined by the gate material, epitaxially growing a semiconductor material on an exposed cross section of the nanowire in the first cavity, removing the hardmask layer and the capping layer, forming a second capping layer around the semiconductor material epitaxially grown in the first cavity to define a channel region, and forming a source region and a drain region contacting the channel region.

19 Claims, 10 Drawing Sheets

(56) References Cited

OTHER PUBLICATIONS

Wang, "Device Physics and Simulation of Silicon Nanowire Transistors," Ph.D. Thesis, Purdue University, Aug. 2005, 149 pages.

Wernersson, et al., "III-V Nanowires—Extending a Narrowing Road," Proceedings of the IEEE vol. 98, No. 12, Dec. 2010, pp. 2047-2060.

International Search Report and Written Opinion; International Application No. PCT/US12/69458; International Filing Date: Dec. 13, 2012; Date of mailing: Feb. 25, 2013; 13 pages.

NANOWIRE FIELD EFFECT TRANSISTORS

CROSS-REFERENCE TO RELATED APPLICATIONS

This is a continuation application of and claims priority from U.S. application Ser. No. 13/343,799, filed on Jan. 5, 2012, the entire contents of which are incorporated herein by reference.

FIELD OF INVENTION

The present invention relates to semiconductor nanowire field effect transistors.

DESCRIPTION OF RELATED ART

A nanowire field effect transistor (FET) often includes a nanowire having a channel region. Portions of the channel region are surrounded with gate materials. Active source and drain regions are connected to the channel region.

BRIEF SUMMARY

According to one embodiment of the present invention, a method for forming a nanowire field effect transistor (FET) device includes forming a nanowire over a substrate, forming a liner material around a portion of the nanowire, forming a capping layer on the liner material, forming a first spacer adjacent to sidewalls of the capping layer and around portions of the nanowire, forming a hardmask layer on the capping layer and the first spacer, removing an exposed portion of the nanowire to form a first cavity partially defined by the gate material, epitaxially growing a semiconductor material on an exposed cross section of the nanowire in the first cavity, removing the hardmask layer and the capping layer, forming a second capping layer around the semiconductor material epitaxially grown in the first cavity to define a channel region, and forming a source region and a drain region contacting the channel region.

According to another embodiment of the present invention, a method for forming a nanowire field effect transistor (FET) device includes forming a nanowire over a substrate, forming a liner material around a portion of the nanowire, forming a capping layer on the liner material, forming a first spacer adjacent to sidewalls of the capping layer and around portions of the nanowire, forming a hardmask layer on the capping layer and the first spacer, removing an exposed portion of the nanowire to form a first cavity partially defined by the gate material, epitaxially growing a semiconductor material on an exposed cross section of the nanowire in the first cavity, removing portions of the hardmask layer and the capping layer to define a channel region, and forming a source region and a drain region contacting the channel region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Previous top-down methods for fabricating nanowire FET devices fail to provide a suitable method for forming a nanowire having dissimilar materials. The methods and resultant structures described below provide a nanowire FET device that may include any number of epitaxially grown materials formed in a nanowire.

Figure 1:
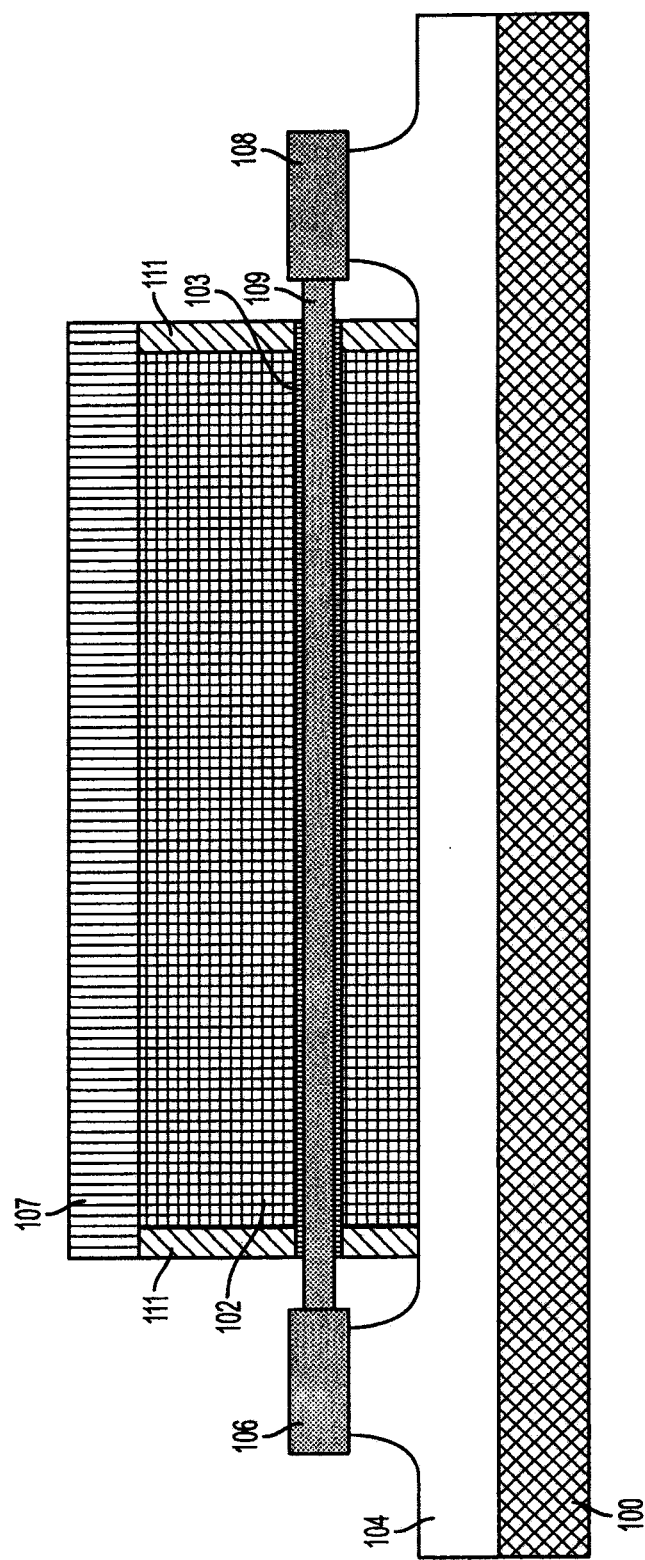
FIG. 1 illustrates a cross-sectional view of a portion of FET devices during fabrication.

FIG. 1 illustrates a cross-sectional view of a portion of FET devices during fabrication. In this regard, a silicon on insulator (SOI) pad region 106, pad region 108, and nanowire portion (nanowire) 109 are defined on a buried oxide (BOX) layer 104 that is disposed on a silicon substrate 100. The pad region 106, pad region 108, and nanowire portion 109 may be patterned by the use of lithography followed by an etching process such as, for example, reactive ion etching (RIE). Once the pad region 106, pad region 108, and nanowire portion 109 are patterned, an isotropic etching process suspends the nanowires 109 above the BOX layer 104. Following the isotropic etching, the nanowire portions 109 may be smoothed to form elliptical shaped (and in some cases, cylindrical shaped) nanowires 109 that are suspended above the BOX layer 104 by the pad region 106 and the pad region 108. An oxidation process may be performed to reduce the diameter of the nanowires 109 to desired dimensions.

Once the nanowires 109 are formed, a gate stack (comprising of several films) 103 may be formed around the nanowires 109, as described in further detail below, and capped with a polysilicon layer (capping layer) 102. A hardmask layer 107, such as, for example, silicon nitride ($Si_3N_4$) is deposited over the capping layer 102. The capping layer 102 and the hardmask layer 107 may be formed by depositing polysilicon material over the BOX layer 104 and the SOI portions, depositing the hardmask material over the polysilicon material, and etching by reactive ion etching (RIE) to form the capping layer 102 and the hardmask layer 107 illustrated in FIG. 1. Following the formation of the capping layer 102, a spacer 111 may be formed adjacent to opposing sides of the capping layer 102. The spacer 111 may include, for example, an oxide or a nitride material. The fabrication of the arrangement shown in FIG. 1 may be performed using similar methods as described above for the fabrication of a single row of gates. The methods described herein may be used to form any number of devices on a nanowire between pad regions 106 and 108.

The gate stack 103 is formed by depositing any type of gate material(s) around the nanowire 109. For example, a first gate dielectric layer, such as silicon dioxide ($SiO_2$) may be formed around the nanowire 109. A second gate dielectric layer such as, for example, hafnium oxide ($HfO_2$) may be formed around the first gate dielectric layer 120. A metal layer such as, for example, tantalum nitride (TaN) may formed around the second gate dielectric layer. The metal layer is surrounded by the capping layer 102. Doping the capping layer 102 with impurities such as boron (p-type), or phosphorus (n-type) makes the capping layer 102 conductive.

The gate material 103 is not limited to the materials described above, and may include any number of layers of materials including a single layer. The gate material 103 in alternate embodiments may include a sacrificial material (liner material) or materials that may be deposited in a similar manner as described above, and subsequently removed in a step described below and replaced with gate materials or layers of gate materials similar to the arrangements described above.

Figure 2:
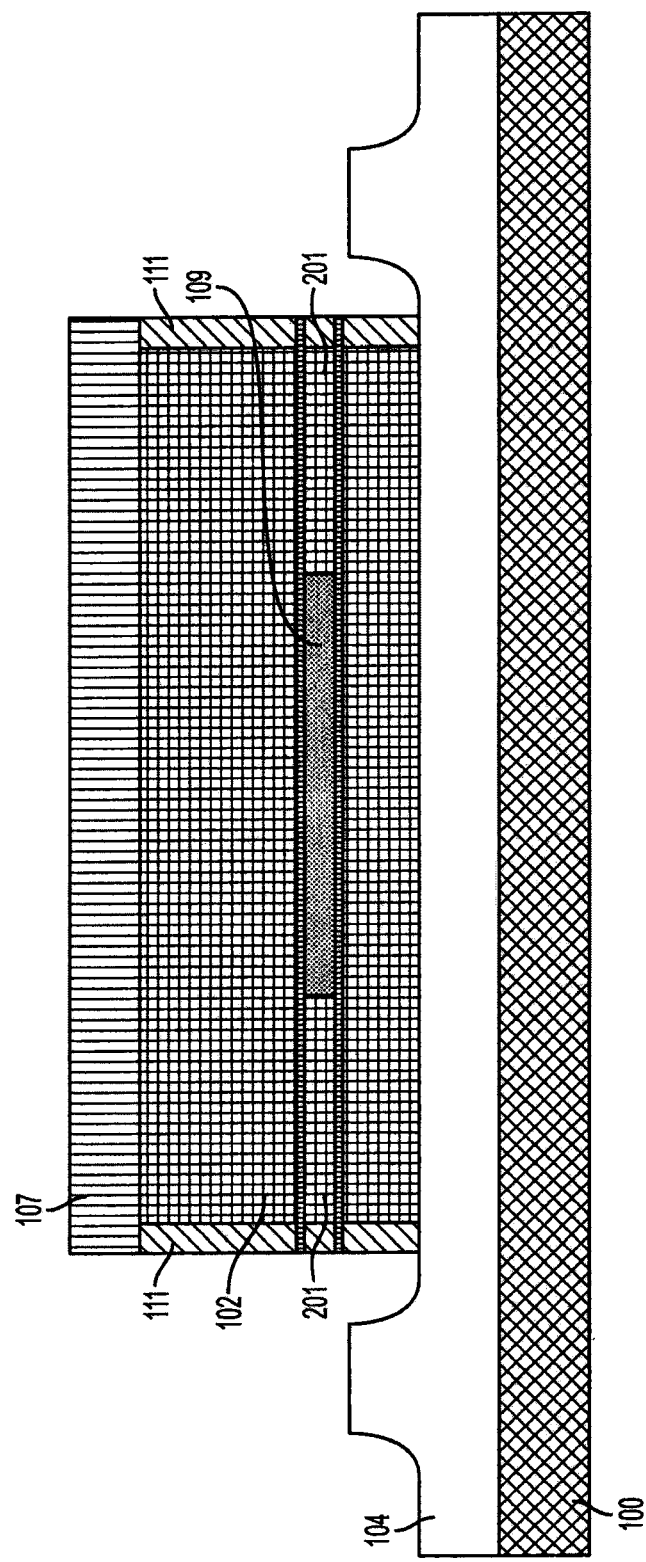
FIG. 2 illustrates the resultant structure following an isotropic etching process.

FIG. 2 illustrates the resultant structure following an isotropic etching process such as, for example a wet etching process or an isotropic reactive ion etching (RIE). The etching process removes the exposed silicon pad regions 106 and 108 (of FIG. 1) and portions of the nanowire 109, resulting in cavities 201 that are partially defined by the gate material 103 and the nanowire 109. Though the illustrated embodiment shows the formation of the cavities 201 on opposing ends of the nanowire 109, in a symmetrical arrangement, alternative embodiments may include the formation of a single cavity or two asymmetrical cavities. Such an arrangement may be formed by removing a portion of the nanowire 109 using, for example, an asymmetric etching process such that a distal end of the nanowire 109 is substantially flush with the spacer 111. A spacer (not shown) may be formed adjacent to one of the spacers 111 such that the one of the exposed distal ends of the nanowire 109 is obscured by the spacer. The isotropic etching process may be performed as described above to remove the opposing exposed portion of the nanowire 109 to form a single cavity 201. The spacer may then be removed in a subsequent process.

Figure 3:
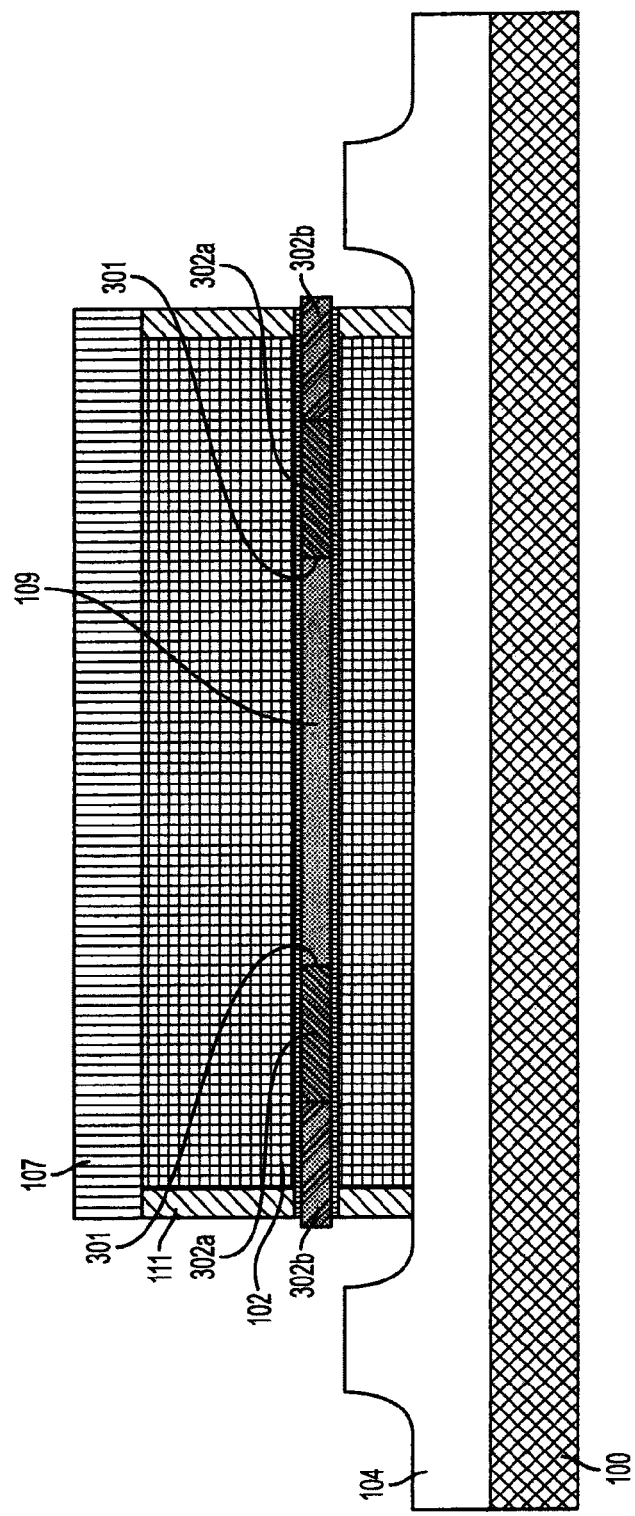
FIG. 3 illustrates an exemplary embodiment of the resulting structure following the epitaxial growth of nanowire material.

FIG. 3 illustrates an exemplary embodiment of the resulting structure following the epitaxial growth of nanowire material 302. The nanowire material 302 may include any desired epitaxially grown material and/or combinations of materials. In the illustrated exemplary embodiment, the nanowire material 302 includes a first type of material 302a and a second type of material 302b that are formed by two epitaxial growth processes. The nanowire material 302 may include for example, epitaxially grown Si, SiGe, Ge, or group III-V materials. The nanowire material 302 may be formed symmetrically as shown such that the nanowire material 302 is formed (i.e., seeded) on exposed opposing distal ends 301 of the nanowire 109 and subsequently on exposed distal ends of the epitaxially grown nanowire material 302. Alternatively, the nanowire material 302 may be formed asymmetrically as will be described in further detail below.

Figure 4:
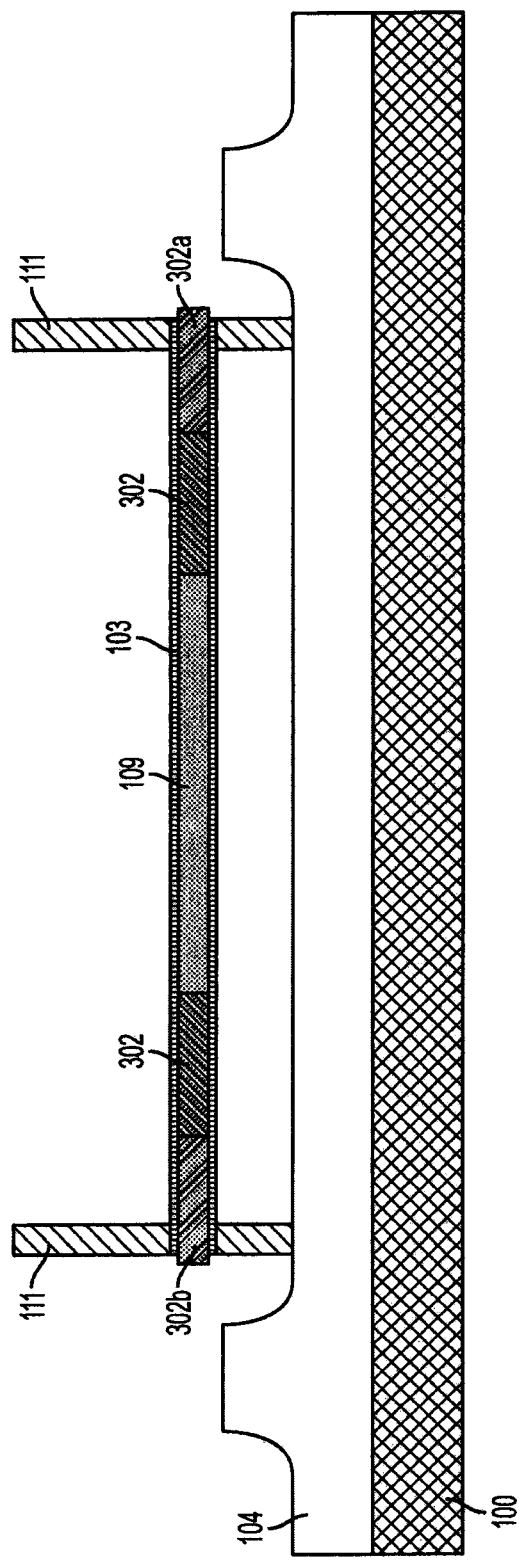
FIG. 4 illustrates the resultant structure following the removal of the hardmask layer and the capping layer.

FIG. 4 illustrates the resultant structure following the removal of the hardmask layer 107 and the capping layer 102 using a suitable etching process such as, for example, reactive ion etching. In some embodiments an etching process may undesirably remove portions of the capping layer 102 and the nanowire material 302. To avoid removing portions of the nanowire material 302 while removing the capping layer 102, the capping layer 102 may be formed from a material that is different from the nanowire material 302 such that a selective etching process may remove the capping layer 102 without appreciably removing the exposed nanowire material 302. The spacer 111 remains such that the gate material 103, the nanowire 109, and the nanowire material 302 are supported and suspended by the spacer 111. Following the removal of the hardmask layer 107 and the capping layer 102 the exposed gate material 103 may be removed to expose portions of the nanowire material 302 (and/or the nanowire 109). Another gate material 103 or layers of gate materials 103 may be formed over the exposed portions of the nanowire material 302 (and/or the nanowire 109) in a similar manner as described above.

Figure 5:
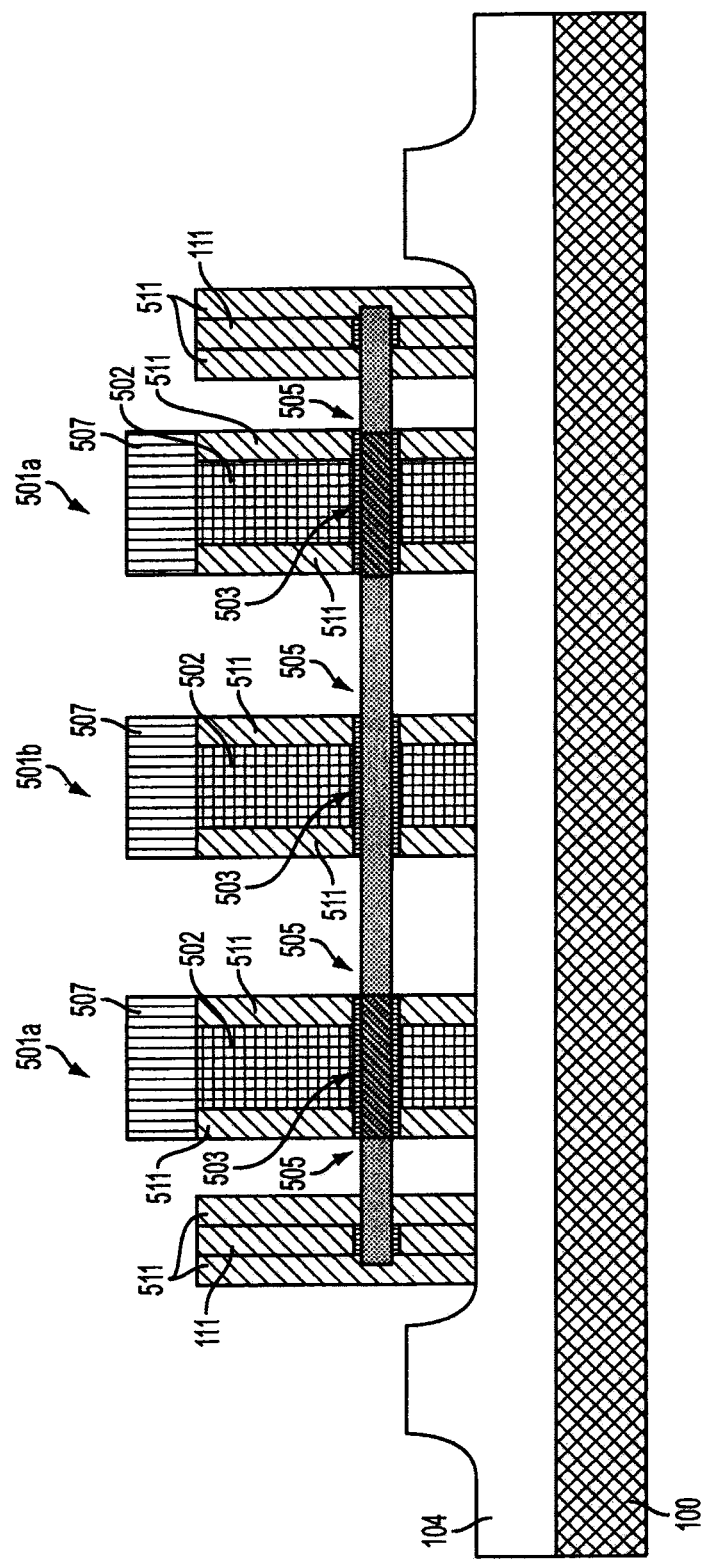
FIG. 5 illustrates the resultant structure following the formation of a capping layer and a hardmask layer around portions of the gate material.

FIG. 5 illustrates the resultant structure following the formation of a capping layer 502 and a hardmask layer 507 around portions of the gate material 103, which substantially forms field effect transistor (FET) devices 501. Spacer material 511 may be formed adjacent to opposing sides of the capping layer 502. The capping layer 502, the hardmask layer 507, and the spacer material 511 are formed in a similar manner as the capping layer 102, the hardmask layer 517, and the spacer 111 (of FIG. 1) described above and are patterned using a photolithographic masking and etching process. Following the formation of the capping layer 502 (or the spacer material 511) the exposed gate material 103 may be removed to expose portions of the nanowire material 302 (and/or the nanowire 109). Exposed portions of the nanowire material 309 (and/or the nanowire 109) may be doped with ions to form active regions 505 (source and drain regions) of the FET devices 501. A silicide material (not shown) may be formed on the active regions 505 of the nanowire material 302, and conductive contacts (not shown) may be formed that contact the silicide material. In the illustrated embodiment, the FET devices 501a include dissimilar materials in the channel regions 503, while the FET device 501b includes a uniform material in the channel region 503. In some embodiments, the active regions of the FET devices 501 may be formed using an in-situ doping process during the epitaxial growth process such that the dopants are disposed in a portion of the nanowire material 302 during the growth process. The subsequent formation of the capping layer 502, the hardmask layer 507, and the spacer material 511 would leave portions of the active regions 505 exposed.

Figure 6:
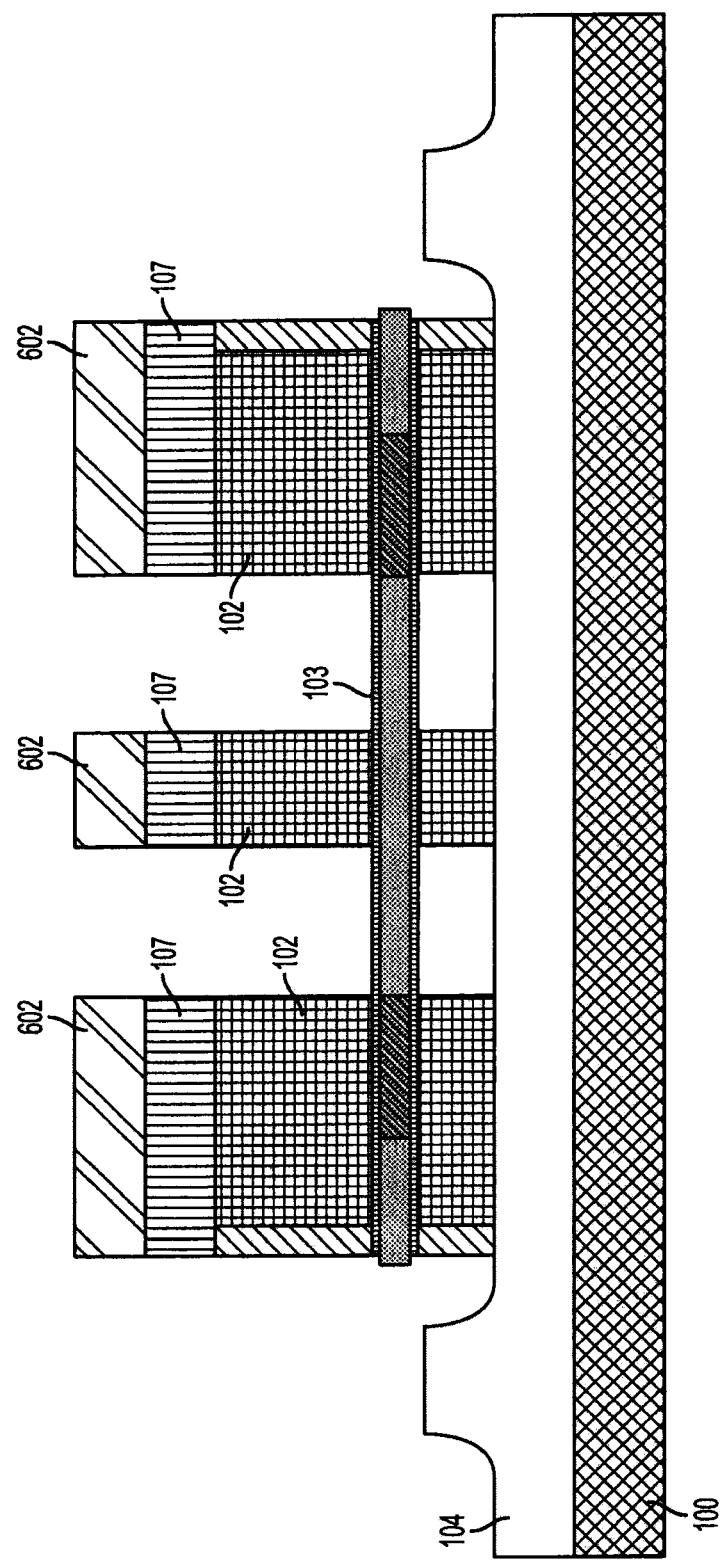
FIG. 6 illustrates the resultant structure following an alternate exemplary method for fabricating nanowire devices.

FIG. 6 illustrates the resultant structure following an alternate exemplary method. In this regard, following the formation of the nanowire material 302 (as described above in FIG. 3), portions of the capping layer 102 and the hardmask layer 107 are removed using a photolithographic patterning and etching process that exposes portions of the gate material 103 and the BOX layer 104. A photolithographic resist material 602 is shown for illustrative purposes disposed on the hardmask layer 107. The photolithographic resist material 602 may be removed in some exemplary embodiments following the removal of the exposed portions of the hardmask layer 107 and prior to the removal of the capping layer 102.

Figure 7:
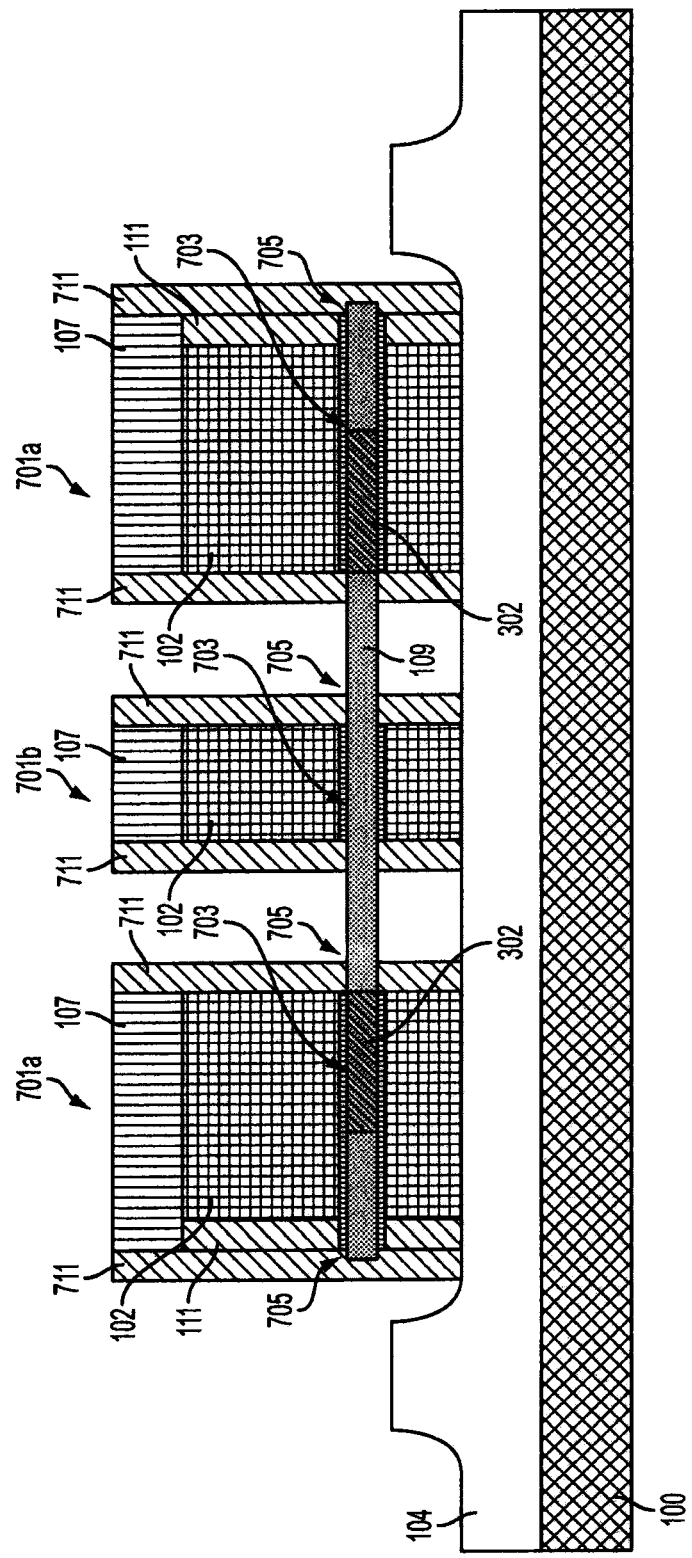
FIG. 7 illustrates the resultant structure that includes FET devices following the formation of spacer material.

FIG. 7 illustrates the resultant structure that includes FET devices 701 following the formation of spacer material 711 that may include, for example, an oxide or nitride material. The spacer material 711 is formed adjacent to the exposed portions of the capping layer 102 and surrounds portions of the exposed nanowire 109 and/or nanowire material 302. In the illustrated embodiment, the FET devices 701a include dissimilar materials in the channel regions 703, while the FET device 701b includes a uniform material in the channel region 703. Exposed portions of the nanowire material 302 (and/or the nanowire 109) may be doped with ions to form active regions 705 (source and drain regions) of the FET devices 701. Following the formation of the active regions 705, a silicide material (not shown) may be formed on the active regions 705 and conductive contacts (not shown) may be formed over the silicide material. In some embodiments, the active regions of the FET devices 701 may be formed using an in-situ doping process during the epitaxial growth process such that the dopants are disposed in a portion of the nanowire material 302 during the growth process. The subsequent removal of portions of the capping layer 102 would expose portions of the active regions.

Figure 8:
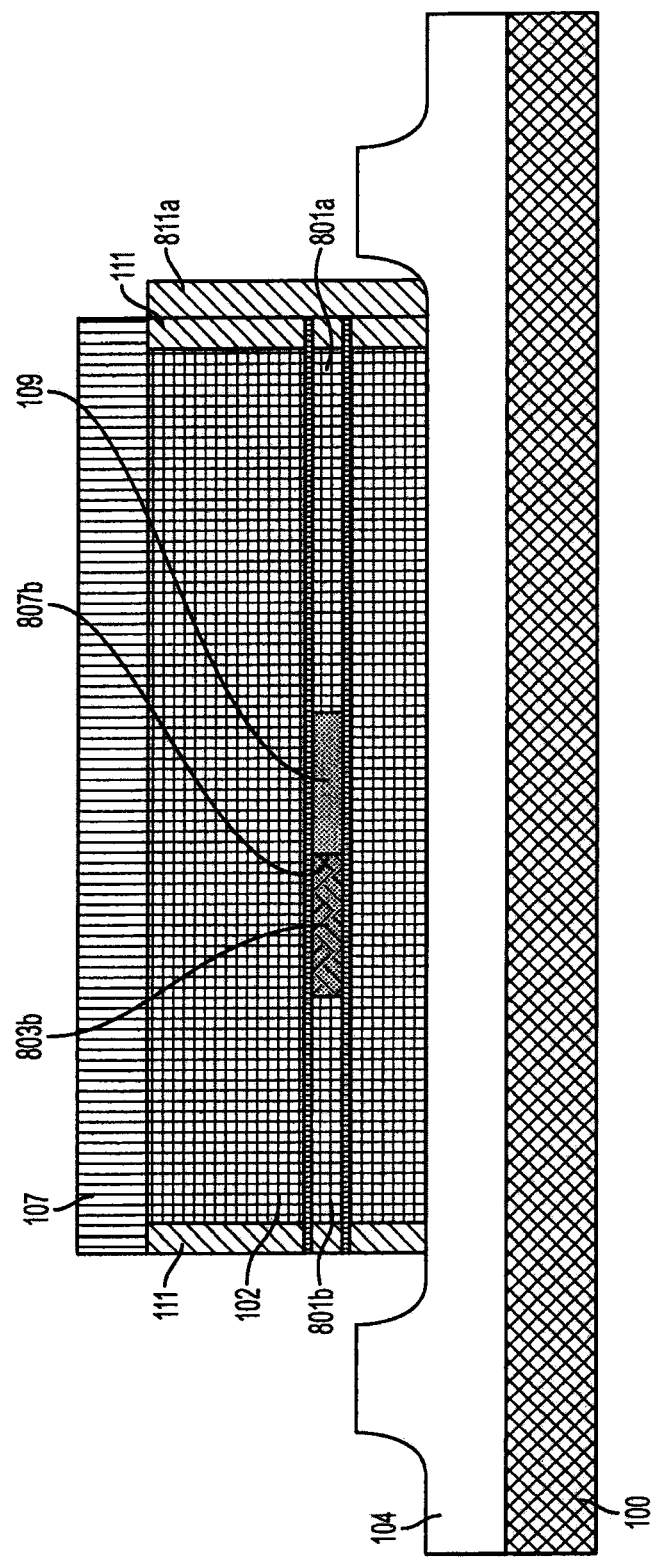
FIG. 8 illustrates an alternate exemplary method for fabricating nanowire devices.

FIG. 8 illustrates an alternate exemplary method for fabricating nanowire devices. In this regard, illustrates the resultant structure following an isotropic etching process on a nanowire structure similar to the structure described above in FIG. 1. The isotropic etching process is also similar to the process described above in FIG. 2. The etching process removes exposed portions of the nanowire 109 to form the cavities 801 that are partially defined by the gate materials 103 and the nanowire 109. Following the formation of the cavities 801, a spacer 811 is formed adjacent to one of the spacers 111 such that the opening of the cavity 801a is obscured or covered. The illustrated arrangement of the spacer 811 may be formed by, for example, forming the spacer 811 and a spacer (not shown) on the opposing side of the capping layer 102, the opposing spacer may be removed by, for example, irradiating the spacer such that the spacer may be removed using an etching process that removed the irradiated spacer material at a faster rate than the removal of the non-irradiated spacer 811. For example, the asymmetry in the irradiation process can be obtained by using an ion source at an angle to the wafer surface so ions are irradiating one spacer while the other spacer is shadowed by the gate 102. Following the formation of the spacer 811, an epitaxial growth process may be performed to form the nanowire material 803b in the exposed channel 801b seeded from the exposed distal end 307b of the nanowire 109 in a similar manner as described above in FIG. 3.

Figure 9:
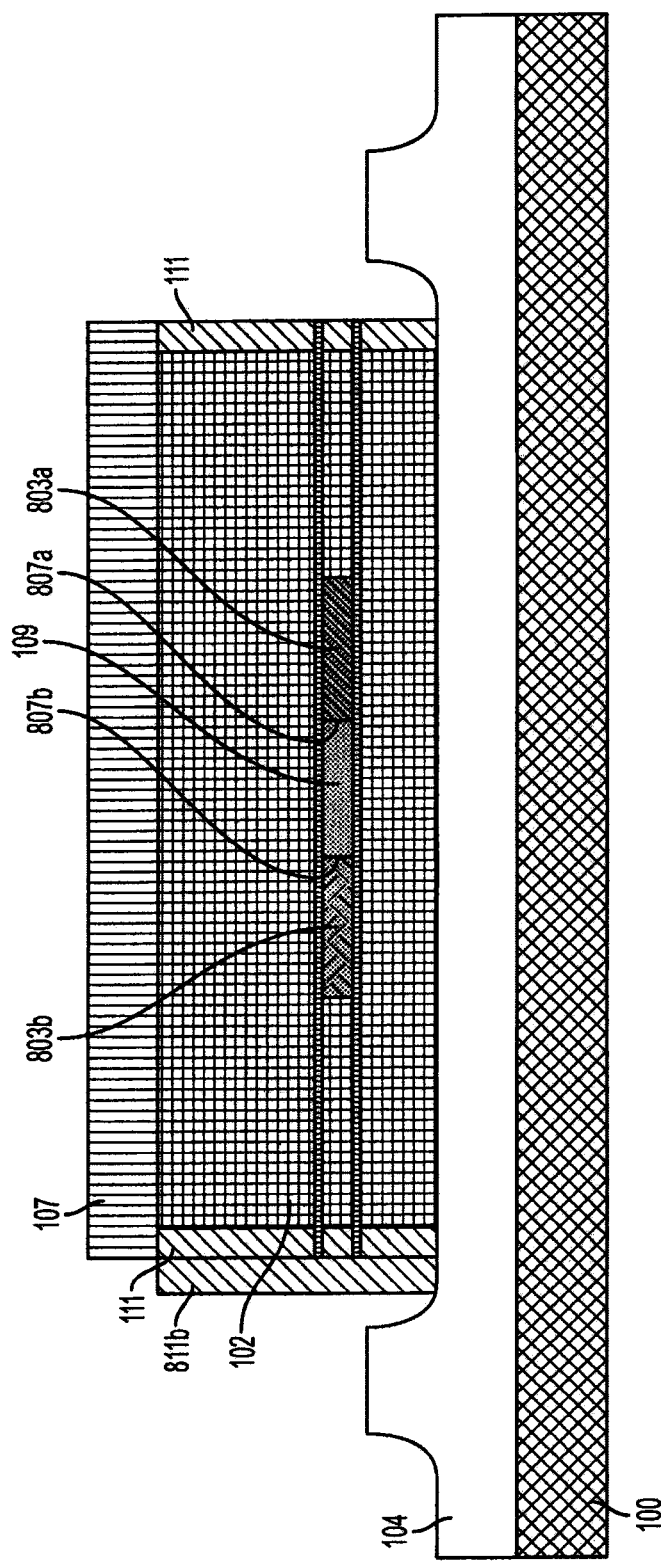
FIG. 9 illustrates the resultant structure following the formation of nanowire material.

FIG. 9 illustrates the resultant structure following the formation of nanowire material 803a that is formed following the removal of the spacer 811a (of FIG. 8) and the formation of the spacer 811b a similar manner as described above. In the illustrated embodiment the nanowire material 803a and 803b are dissimilar materials and may include any of the epitaxially grown materials described above in FIG. 3.

Figure 10:
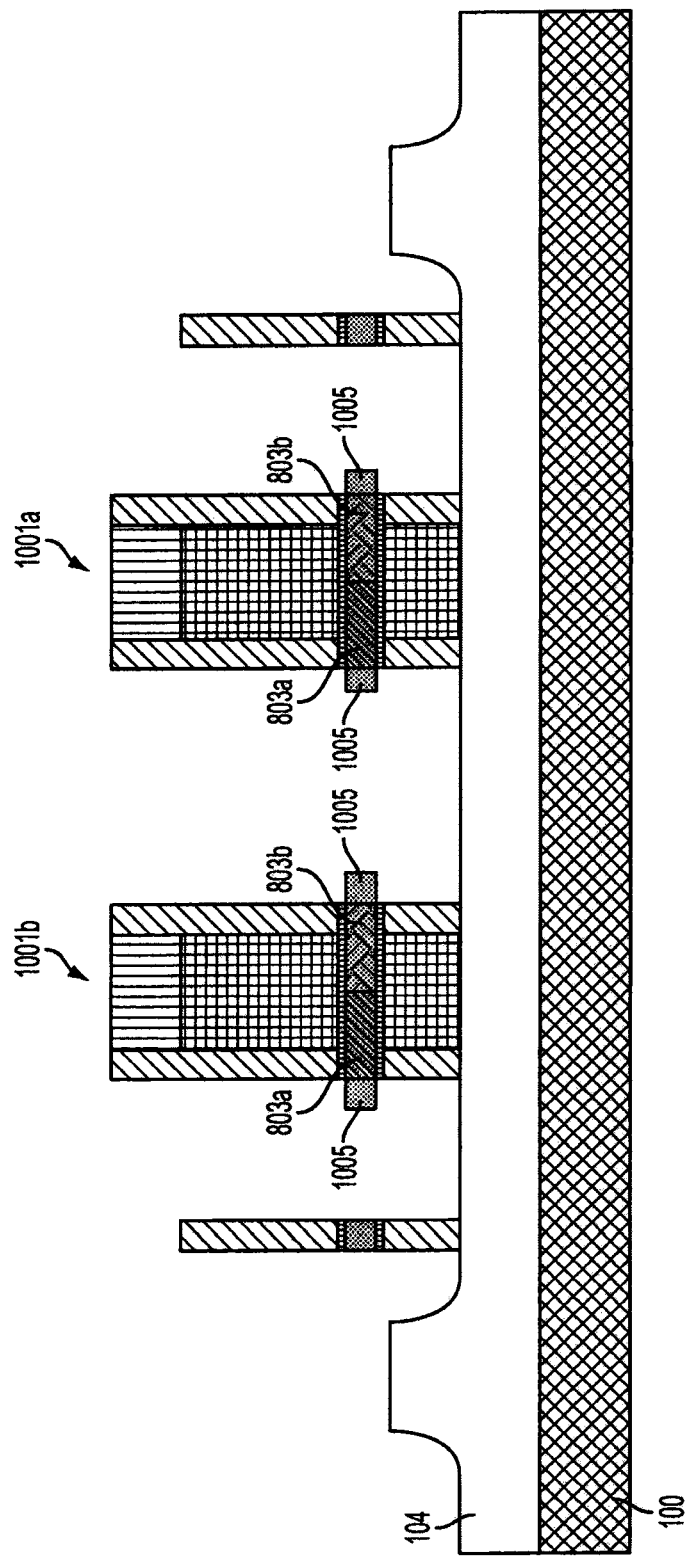
FIG. 10 illustrates the resultant structure that includes FET devices.

FIG. 10 illustrates the resultant structure that includes FET devices 1001 following a series of growth cycles that form nanowire materials 803. Alternate embodiments may include any combination of nanowire materials 803 that are formed using similar methods as described above in FIGS. 8 and 9. The FET device 1001a includes a channel region 1002a that includes the nanowire material (channel material) 803a and 803b, while the FET device 1001b includes a channel region 1002b that includes the nanowire material 803a and 803b. The FET devices 1001a and 1001b are arranged adjacent to each other on the BOX layer 104, and the nanowire materials 803a and 803b are dissimilar. The channel regions 1002a and 1002b include dissimilar nanowire material 803a and 803b, respectively, in facing sides of the channel regions 1002a and 1002b. I.e., each of the channel regions 1002 of the adjacent FET devices 1001 includes dissimilar materials that are arranged asymmetrically. Active (source and drain) regions 1005 are formed contacting the channel region 1002a and 1002b in a similar manner as described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention, and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:
1. A method for forming a nanowire field effect transistor (FET) device, the method comprising:
    forming a nanowire over a substrate;
    forming a liner material around a portion of the nanowire;
    forming a capping layer on the liner material;
    forming a first spacer adjacent to sidewalls of the capping layer and around portions of the nanowire;
    forming a hardmask layer on the capping layer and the first spacer;
    removing an exposed portion of the nanowire to form a first cavity partially defined by a gate material;
    epitaxially growing a semiconductor material on an exposed cross section of the nanowire in the first cavity;
    removing the hardmask layer and the capping layer;
    forming a second capping layer around the semiconductor material epitaxially grown in the first cavity to define a channel region; and
    forming a source region and a drain region contacting the channel region.

2. The method of claim 1, further including:
    removing an exposed portion of the nanowire to form a second cavity partially defined by the liner material;
    epitaxially growing a semiconductor material on the exposed cross section of the nanowire in the second cavity.

3. The method of claim 2, wherein the semiconductor material epitaxially grown in the first cavity is dissimilar from the semiconductor material epitaxially grown in the second cavity.

4. The method of claim 2, wherein the semiconductor material epitaxially grown in the first cavity and the semiconductor material epitaxially grown in the second cavity are grown simultaneously.

5. The method of claim 2, wherein the second capping layer is formed around the semiconductor material epitaxially grown in the first cavity and the semiconductor material epitaxially grown in the second cavity.

6. The method of claim 1, further comprising forming a third capping layer around a portion of the semiconductor material epitaxially grown in the first cavity.

7. The method of claim 1, further comprising forming a third capping layer around the nanowire.

8. The method of claim 1, further including forming a spacer material adjacent to the second capping layer.

9. The method of claim 1, wherein the substrate includes a buried oxide layer.

10. The method of claim 1, wherein the liner material includes a gate material.

11. The method of claim 1, wherein the liner material is a gate structure.

12. A method for forming a nanowire field effect transistor (FET) device, the method comprising:
   forming a nanowire over a substrate;
   forming a liner material around a portion of the nanowire;
   forming a capping layer on the liner material;
   forming a first spacer adjacent to sidewalls of the capping layer and around portions of the nanowire;
   forming a hardmask layer on the capping layer and the first spacer;
   removing an exposed portion of the nanowire to form a first cavity partially defined by a gate material;
   epitaxially growing a semiconductor material on an exposed cross section of the nanowire in the first cavity;
   removing portions of the hardmask layer and the capping layer to define a channel region; and
   forming a source region and a drain region contacting the channel region.

13. The method of claim 12, further including:
   removing an exposed portion of the nanowire to form a second cavity partially defined by the liner material;
   epitaxially growing a semiconductor material on the exposed cross section of the nanowire in the second cavity.

14. The method of claim 13, wherein the semiconductor material epitaxially grown in the first cavity is dissimilar from the semiconductor material epitaxially grown in the second cavity.

15. The method of claim 13, wherein the semiconductor material epitaxially grown in the first cavity and the semiconductor material epitaxially grown in the second cavity are grown simultaneously.

16. The method of claim 12, further including forming a spacer material adjacent to the capping layer.

17. The method of claim 12, wherein the substrate includes a buried oxide layer.

18. The method of claim 12, wherein the liner material includes a gate material.

19. The method of claim 12, wherein the liner material is a gate structure.

* * * * *